United States Patent [19]

Kobayashi

[11] Patent Number: 5,387,935
[45] Date of Patent: Feb. 7, 1995

[54] SOLID STATE IMAGING DEVICE HAVING DUAL H-CCD WITH A COMPOUND CHANNEL

[75] Inventor: Atsushi Kobayashi, Kanagawa, Japan

[73] Assignee: Sony Corporation, Tokyo, Japan

[21] Appl. No.: 124,211

[22] Filed: Sep. 21, 1993

[30] Foreign Application Priority Data

Sep. 22, 1992 [JP] Japan .................. 4-277867

[51] Int. Cl.$^6$ ........................................... H04N 5/335
[52] U.S. Cl. .................. 348/323; 348/316; 348/319; 348/321; 348/322
[58] Field of Search ............ 358/209, 213.22, 213.23, 358/213.26, 213.27, 213.29, 213.28; 348/302, 303, 311, 316, 319, 320, 321, 322, 323; H04N 5/335

[56] References Cited

U.S. PATENT DOCUMENTS

| | | | |
|---|---|---|---|
| 5,040,071 | 8/1991 | Stevens | 358/213.16 |
| 5,068,701 | 11/1991 | Prieur-Drevon | 357/24 |
| 5,182,623 | 1/1993 | Hynecek | 257/230 |
| 5,196,939 | 3/1993 | Elabd et al. | 358/213.11 |

Primary Examiner—Yon J. Couso
Assistant Examiner—Ngoc-Yen Vu
Attorney, Agent, or Firm—Hill, Steadman & Simpson

[57] ABSTRACT

A solid state imaging device having a horizontal transfer register formed of a plurality of transfer sections for alternately transferring a signal charge of the same pixel in the horizontal direction wherein a signal charge can be distributed between respective transfer sections in consideration of the amount of signal charges handled by the respective transfer section. In a first horizontal transfer register (4) having transfer sections (4a) and (4b), a control gate section (5) that distributes signal charges between the respective transfer sections (4a) and (4b) has on its one region a potential barrier section (13) formed along the horizontal transfer direction. After a signal charge of the amount determined by an area of that region and a potential (height) of the potential barrier section (13) was accumulated in the control gate section (5) at its region where the potential barrier section (13) is not formed, the signal charge is distributed between the transfer sections (4a) and (4b) by holding the potential of the potential barrier section (13) at middle level.

5 Claims, 2 Drawing Sheets

SOLID STATE IMAGING DEVICE HAVING DUAL H-CCD WITH A COMPOUND CHANNEL

BACKGROUND OF THE INVENTION

1. Field of the Invention

The present invention relates generally to solid state imaging devices and, more particularly, is directed to a solid state imaging device of a so-called all pixel read out type.

2. Description of the Prior Art

Conventional CCD (charge-coupled device) solid state imaging devices include two horizontal transfer registers, for example, in order to improve a resolution. Signal charges of odd-numbered lines and signal charges of even-numbered lines are simultaneously transferred by the two separate horizontal transfer registers and signal charges of two lines are read out during 1H (H is a horizontal scanning period) to thereby read out full pixels.

In order to increase the amount of signal charges that the horizontal transfer register can handle sufficiently, the channel width of the horizontal transfer register must be increased in accordance therewith.

The reason for this is that, when an amplitude of a horizontal transfer clock is made constant, the amount of signal charge handled by the horizontal transfer register is proportional to the area of the horizontal transfer register per bit so that the amount of signal charges handled by the horizontal transfer register can be increased by increasing the channel length and channel width of the horizontal transfer register per bit. In this case, however, the channel length of the horizontal transfer register per bit is restricted by the dimensions of an image section so that only the channel width of the horizontal transfer register is allowed to be increased.

However, if the channel width of the horizontal transfer register is increased, then intensity of electric field produced in the horizontal transfer register is decreased by the horizontal transfer clock applied to the transfer electrode. The intensity of electric field is decreased particularly at the central portion of the horizontal transfer register in the channel width direction.

As the intensity of the transfer electric field is decreased, a transfer rate of signal charge in the vertical direction of the horizontal transfer register is lowered. Consequently, it is frequently observed that a part of signal charges cannot be transferred.

Therefore, in the conventional CCD solid state imaging device of all pixel read out type, when signal charges of one line are parallelly transferred from the register at the image section side to the register at the opposite side of the two horizontal transfer registers, the signal charges cannot be transferred completely. There is then the risk that an image quality is deteriorated.

The assignee of the present application has previously proposed a CCD solid state imaging device of all pixel read out type in which a horizontal transfer register at the image section side is formed of transfer sections of a plurality of stages (e.g., two stages) and signal charge of the same pixel is horizontally transferred by these transfer sections individually in order to increase the amount of signal charges by the horizontal transfer registers without lowering the transfer rate in the horizontal transfer register (see Japanese laid-open patent publication No. 3-72790).

A schematic structure and operation of such previously-proposed CCD solid state imaging device will be described below.

FIG. 1 of the accompanying drawings shows a structure of the conventional CCD solid state imaging device. As shown in FIG. 1, a CCD image sensor section 3 of an interline transfer type comprises a plurality of photo-sensors 1 arrayed at the unit of pixel in a two-dimensional fashion and a plurality of vertical transfer registers 2 disposed at every vertical column of these photo-sensors 1 to vertically transfer signal charges generated by the photo-sensors 1.

A first horizontal transfer register 4 is disposed under the image section 3. The first horizontal transfer register 4 comprises two transfer sections 4a, 4b that simultaneously transfer a signal charge of one line in the horizontal direction in a divided fashion. These transfer sections 4a, 4b are substantially the same in channel width. The transfer sections 4a, 4b are spaced apart a little and arranged in parallel to each other and unitarily formed as one body in an output section. A sum of channel widths of the transfer sections 4a, 4b becomes the channel width of the first horizontal transfer register 4. The value of this channel width of the first horizontal transfer register 4 is set sufficient so that the amount of signal charges handled by the first horizontal transfer register 4 can be increased sufficiently.

In the first horizontal transfer register 4, a control gate section 5 is disposed between the two transfer sections 4a, 4b. A signal charge of the same pixel is distributed to transfer sections 4a, 4b under the control of the control gate section 5.

Under the first horizontal transfer register 4 is disposed parallelly a second horizontal transfer register 6 with a small distance from the first horizontal transfer register 4. The channel width of the second horizontal transfer register 6 is set to be substantially the same as that of the first horizontal transfer register 4.

A transfer gate section 7 is disposed between the first and second horizontal transfer registers 4 and 6. Under the control of the transfer gate section 7, the signal charge of one line that was transferred from the vertical transfer registers 1 to the first horizontal transfer register 4 is further transferred to the second horizontal transfer register 6.

The signal charges horizontally transferred by the first and second horizontal transfer registers 4, 6 are converted by output sections $8_1$, $8_2$ into signal voltages and then developed as outputs OUT1, OUT2, respectively.

Since the first horizontal transfer register 4 is formed of the transfer sections 4a, 4b of a plurality of stages (two stages in this example) as described above, the channel widths of the respective transfer sections 4a, 4b are narrow although the channel width of the first horizontal transfer register 4 is large on the whole. Thus, intensity of transfer electric field can be prevented from being lowered, and a transfer rate with which the signal charge is transferred through the first horizontal transfer register 4 to the second horizontal transfer register 6 can be avoided from being lowered.

In other words, the amount of signal charges handled by the first horizontal transfer register 4 can be increased without lowering the transfer rate in the first horizontal transfer register 4.

In the first horizontal transfer register 4, signal charges that had been separately transferred by the transfer sections 4a, 4b in the horizontal direction are joined together again in the output section $8_1$ so that the amount of signals charges handled by the first horizontal transfer register 4 per bit is constant regardless of the amounts of signal charges respectively transferred by the two transfer sections 4a, 4b.

The amounts of signal charges that the two transfer sections 4a, 4b handle per bit are determined by the channel length and channel width of one bit. Therefore, when signal charges are distributed by the two transfer sections 4a, 4b, if the amount of signal charges distributed to one transfer section exceeds the amount of signal charges that the transfer section can handle, then all signal charges of one pixel cannot be transferred completely although the amount of signal charges handled by the first horizontal transfer register 4 is increased.

Therefore, when signal charges are distributed between the two transfer sections 4a, 4b, signal charges must be distributed between the two transfer sections 4a, 4b in consideration of the amounts of signal charges handled by each of the two transfer sections 4a, 4b.

OBJECTS AND SUMMARY OF THE INVENTION

Therefore, it is a general object of the present invention to provide an improved solid state imaging device in which the aforesaid shortcomings and disadvantages encountered with the prior art can be eliminated.

More specifically, it is an object of the present invention to provide a solid state imaging device in which a signal charge can be distributed in consideration of an amount of signal charges handled by respective transfer sections in a horizontal transfer register formed of a plurality of transfer sections for alternately transferring a signal charge of the same pixel in the horizontal direction.

It is another object of the present invention to provide a solid state imaging device in which a signal charge can be transferred from a horizontal transfer register at an image section side to a horizontal transfer register at the opposite side more smoothly in the vertical direction.

According to an aspect of the present invention, there is provided a solid state imaging device provided on a semiconductor body which comprises a plurality of photo sensing elements arranged in a matrix configuration for receiving a light therein and producing a signal charge corresponding to the amount of the received light, a plurality of vertical charge transferring devices, each vertical charge transferring device arranged at one side of a vertical line of the photo sensing elements, for receiving the signal charge from the photo sensing elements and transferring the signal charge in the vertical direction, a first horizontal charge transferring device connected to the vertical charge transferring devices for receiving the signal charge transferred from a first group of alternate vertical charge transferring devices and transferring the signal charge in the horizontal direction to a charge detecting section, a second horizontal charge transferring device connected to the vertical charge transferring devices for receiving the signal charge transferred from a second group of alternate vertical charge transferring devices which are not selected as the first group of the alternate vertical charge transferring devices and transferring the signal charge in the horizontal direction to the charge detecting section, the first horizontal charge transferring device comprising first and second horizontal shift registers, each the first and second horizontal shift registers extending in the horizontal direction, a control gate electrode disposed between the first and second horizontal shift registers and having a plurality of gate portions, each gate portion corresponding to the first group of alternate vertical charge transferring devices, and a potential barrier under the control gate electrode wherein the signal charge received from the first group of alternate vertical charge transferring devices is distributed into the first and second horizontal shift registers.

In accordance with another aspect of the present invention, there is provided a method of operating a solid state imaging device provided on a semiconductor body having a plurality of photo sensing elements for receiving a light therein and producing a signal charge, a plurality of vertical charge transferring devices for receiving and transferring the signal charge from the photo sensing elements to first and second horizontal charge transferring devices, the first and second horizontal charge transferring devices each for receiving and transferring the signal charge from the vertical charge transferring devices to a charge detecting section. This method comprises the steps of receiving the signal charge from a first group of alternate vertical charge transferring devices in the first horizontal charge transferring device, accumulating the signal charge under both a first horizontal shift register and a control gate, dividing the signal charge by a potential barrier located under the control gate and distributing a part of the signal charge to the first horizontal shift register, transferring the distributed signal charge in the first horizontal shift register to the charge detecting section, shifting and distributing a remaining part of the signal charge accumulated under the control gate to the second horizontal shift register, and transferring the distributed signal charge in the second horizontal shift register to the charge detecting section.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENT

The present invention will now be described in detail with reference to the drawings.

Figure 1:
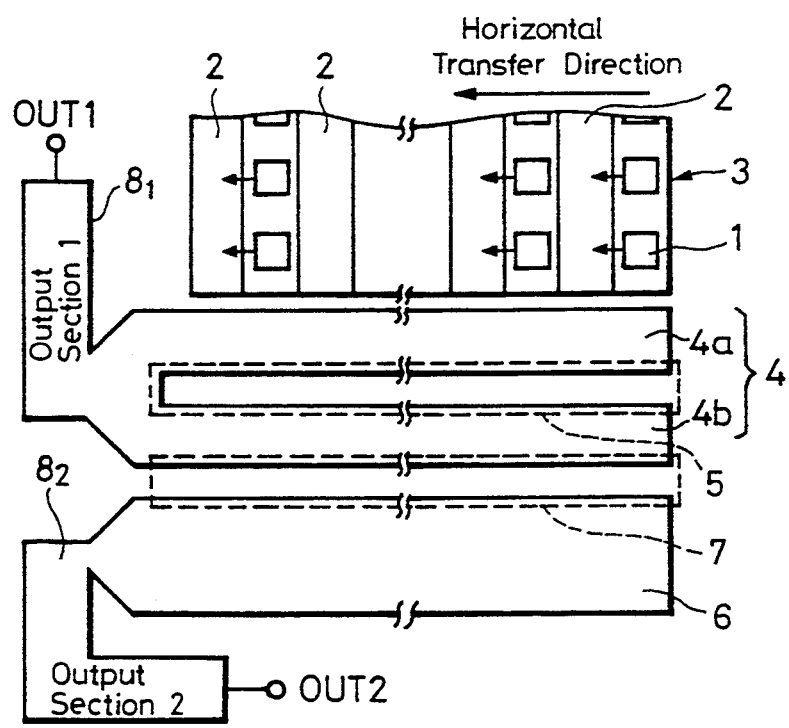
FIG. 1 is a plan view showing a structure of a conventional CCD solid state imaging device of all pixel read out type in which an amount of signal charges handled by a horizontal transfer register can be increased and also a transfer rate of signal charges between horizontal transfer registers can be increased.
Figure 2:
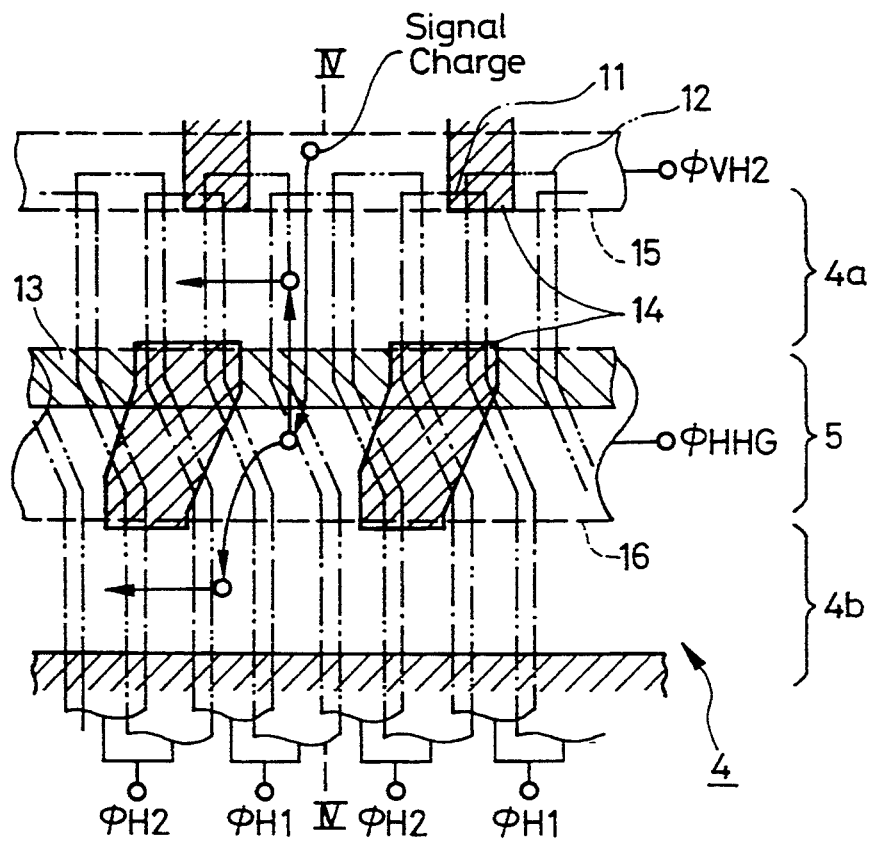
FIG. 2 is a plan view of a CCD solid state imaging device according to an embodiment of the present invention and illustrating one portion of the first horizontal transfer register 4 in FIG. 1.

FIG. 2 is a plan view of a CCD solid state imaging device according to an embodiment of the present invention, and illustrating only a part of the first horizontal transfer register 4 shown in FIG. 1.

As shown in FIG. 2, the first horizontal transfer register 4 is comprised of a plurality of stages, for example, two stages of the transfer sections 4a, 4b that are driven to horizontally transfer signal charges of one line transferred from the image section 3 (see FIG. 1) in a divided fashion. These transfer sections 4a, 4b are substantially the same in channel width and disposed parallelly with a small distance therebetween.

On the substrate of the first horizontal transfer register 4, an accumulation gate electrode (shown by a one-dot chain line) 11 and a transfer gate electrode (shown by a two-dot chain line) 12 are alternately arrayed in the horizontal transfer direction to form an electrode pair. The accumulation gate electrode 11 and the transfer gate electrode 12 are driven by two-phase horizontal transfer clock pulses $\phi H1$, $\phi H2$ applied to these electrode pairs.

Between the transfer sections 4a and 4b is disposed the control gate section 5 that is used to distribute signal charges of the same pixel between the transfer sections 4a, 4b.

The control gate section 5 has on its one portion region of the transfer section 4a side a potential barrier section 13 extended along the horizontal transfer direction.

The potential barrier section 13 is formed by implanting impurity of conductivity type opposite to that of impurity forming a transfer channel at the position at which the potential barrier section 13 is to be formed or by implanting impurity of the same conductivity type in the region of the control gate section 5 except the position at which the potential barrier section 13 is to be formed. Further, the potential barrier section 13 can be formed by controlling a film thickness of a gate oxide film (not shown) of the control gate section 5. In FIG. 2, a hatched area 14 represents a channel stopper section.

Operation of distributing signal charges in the first horizontal transfer register 4 thus arranged will be described next with reference to a timing chart forming FIG. 3 and a potential diagram forming FIG. 4.

Figure 3:
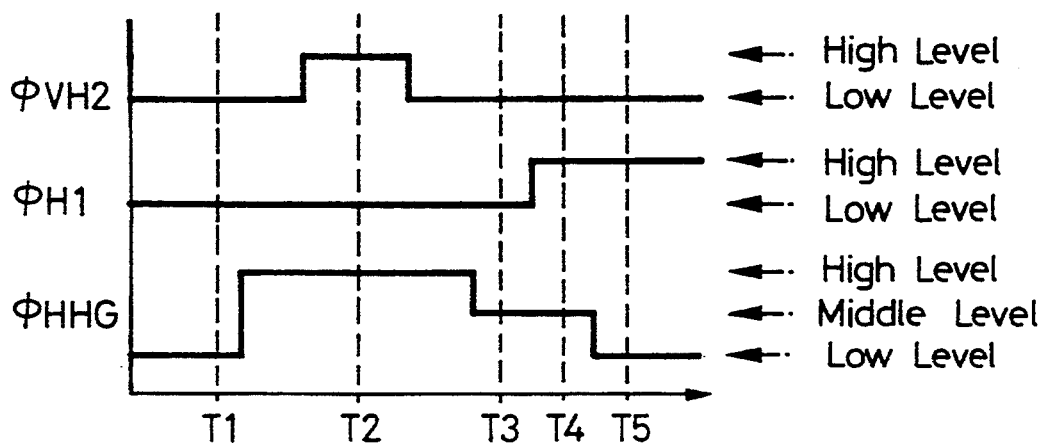
FIG. 3 is a timing chart of respective pulses applied to the solid state imaging device of FIG. 2, and to which references will be made in explaining operation of distributing signal charges.

In FIG. 3, $\phi VH2$ is a gate pulse applied to a gate electrode 15 of the output section of the vertical transfer register 2, and $\phi H1$ is a first phase pulse of the two-phase horizontal transfer clocks. $\phi HHG$ is a gate pulse applied to a gate electrode 16 of the control gate section 5. A horizontal transfer clock pulse $\phi H2$ of a second phase is not shown in FIG. 3 because the horizontal transfer clock pulse $\phi H2$ is constantly held at high level at a timing of distributing a signal charge.

Figure 4:
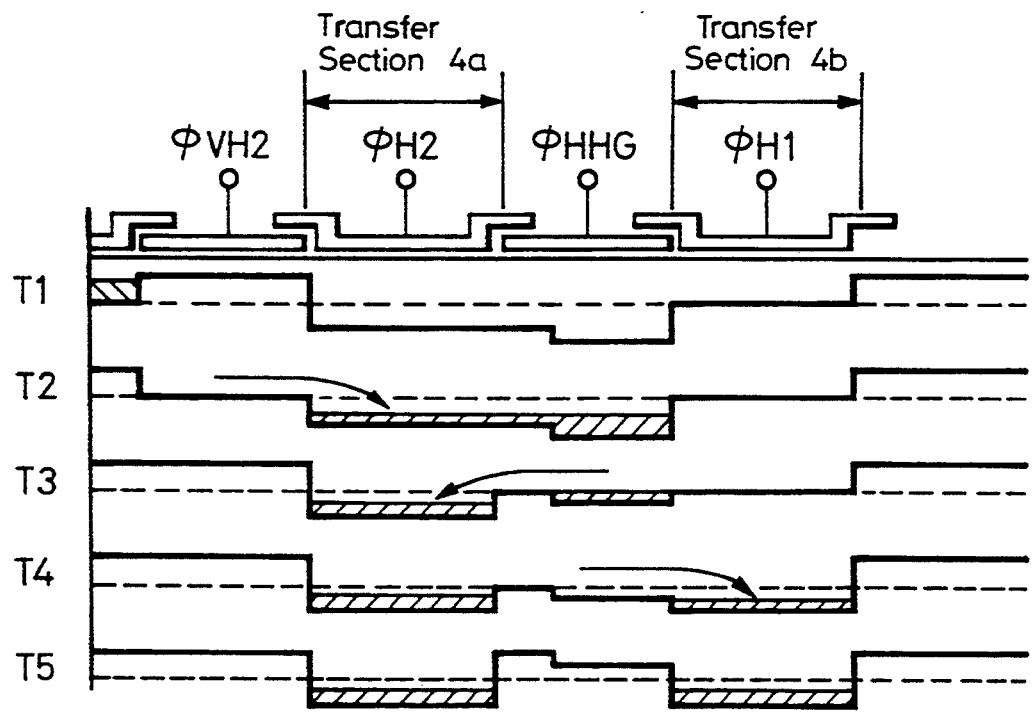
FIG. 4 is a diagram of potential in a cross section taken through the line IV—IV in FIG. 2.

FIG. 4 is a diagram of potential at a cross section taken along the line IV—IV in FIG. 2. In FIG. 4, times T1 to T5 are corresponding to times T1 to T5 in FIG. 3, respectively.

Time T1 shows the condition just before a signal charge is transferred from the vertical transfer register 2 to the first horizontal transfer register 4.

When the gate pulse $\phi VH2$ goes to high level at time T2, a signal charge is transferred from the vertical transfer register 2 to the first horizontal transfer register 4. At time T2, the clock pulse $\phi H1$ is low in level so that the potential of the transfer section 4b is shallow. Also, since the clock pulse $\phi H2$ is held at high level as described above and the gate pulse $\phi HHG$ also is high in level, potentials of the transfer section 4a and the control gate section 5 are deep.

Therefore, the signal charge from the vertical transfer register 2 is transferred to the transfer section 4a and the control gate section 5. In particular, much signal charges are accumulated in the region of the control gate section 5 other than the potential barrier section 13 because the potential barrier section 13 is formed on the control gate section 5.

After the signal charges had been accumulated in the control gate section 5, at time T3, potential of the gate pulse $\phi HHG$ is held at middle level and potential of the potential barrier section 13 is changed to the middle level in a range where such potential can be fluctuated, whereby signal charges of the amount corresponding to the area of region and potential (depth) of the potential barrier section 13 are accumulated in the control gate section 5 at its region in which the potential barrier section 13 is not formed.

In consideration of the amount of signal charges transferred by the transfer section 4b, the amount of the signal charges is determined by the area of the control gate section 5 at its region in which the potential barrier section 13 is not formed and the potential of the potential barrier section 13. This amount of signal charges becomes the amount of signal charges transferred by the transfer section 4b. At that time, the potential of the potential barrier section 13 is set to be the same as or deeper than the potential of the transfer section 4b.

Since the amount of signal charges that can be accumulated in the control gate section 5 is limited, signal charges that could not be accumulated in the control gate section 5 are overflown from the potential barrier section 13 and accumulated in the region of the transfer section 4a. That is to say, the amount of signal charges transferred by the transfer section 4a in the horizontal direction becomes equal to the signal charge amount that results from subtracting the amount of signal charges horizontally transferred by the transfer section 4b from the amount of all signal charges transferred from the vertical transfer register 2.

At time T4, the clock pulse $\phi H1$ goes to high level and the potential of the transfer section 4b becomes deep so that signal charges accumulated in the control gate section 5 are transferred to the transfer section 4b. At the next time T5, the gate pulse $\phi HHG$ goes to low level, whereby the potential of the control gate section 5 becomes shallowest.

According to a series of the aforesaid operation, the signal charges of the same pixel transferred to the first horizontal transfer register 4 from the vertical transfer register 2 are distributed between the transfer sections 4a and 4b on the basis of the amount of signal charges handled by the transfer section 4b.

In the first horizontal transfer register 4, the signal charges distributed between the transfer sections 4a and 4b are returned to the signal charge of one pixel amount again after they had been transferred in the horizontal direction.

In order to restore the signal charge of one pixel amount, the channels of the transfer sections 4a, 4b must be coupled together, for example, in a final stage of the first horizontal transfer register 4, i.e., place in which the first horizontal transfer register 4 need not be divided into two stages, whereby separated signal charges can be formed into a lump of signal charges again when signal charges are transferred in the horizontal direction.

The place in which the first horizontal transfer register 4 need not be divided into two stages is, in the structure of FIG. 1, for example, a place where signal charges need not be transferred from the first horizontal transfer register 4 to the second horizontal transfer register 6, to be more concrete, a horizontal dummy bit or the like where an effective pixel signal is not transferred from the vertical transfer register 2 to the first horizontal transfer register 4.

While the three-value level clock is used as the gate pulse φHHG and the signal charge is distributed at the middle level thereof as described above, the gate pulse φHHG is not limited to the three-value level clock and the following variant also is possible. That is, if a speed at which the gate pulse φHHG falls is decreased adequately by some suitable means such as a delay circuit or the like, then it becomes possible to distribute signal charge.

While the present invention is applied to the solid state imaging device in which the first horizontal transfer register 4 is divided into two stages as described above, the number of stages that the first horizontal transfer register 4 is divided is not limited to two stage and may of course be three stages or more.

When signal charges need not be distributed between the transfer sections 4a, 4b in consideration of the amount of signal charges handled by the respective transfer sections 4a, 4b, signal charges can be distributed between the transfer sections 4a and 4b by making the potential of the control gate section 5 become shallow without changing the potentials of the transfer sections 4a, 4b after the signal charges from the vertical transfer register 2 had been accumulated in the whole first horizontal transfer register 4 including the control gate section 5.

In this case, although signal charges are distributed between the transfer sections 4a and 4b without considering the amount of signal charges handled by the respective transfer sections 4a, 4b, signal charges can be transferred more smoothly from the first horizontal transfer register 4 to the second horizontal transfer register 6 in the horizontal direction because potential of the control gate section 5 in the first horizontal transfer register 4 (image section 3) side is high but is low in the opposite side due to the potential barrier section 13 existing in the control gate section 5.

As described above, according to the present invention, in the first horizontal transfer register having transfer sections of a plurality of stages, the control gate section that distributes signal charges between respective transfer sections has at its one portion of region the potential barrier section formed along the horizontal transfer direction. After signal charges had been accumulated in the control gate section, the signal charges are distributed between the transfer sections by controlling a relative potential difference between the control gate section and the transfer sections. Therefore, the amount of signal charges transferred by one transfer section is determined by the area of the control gate section at its region in which the potential barrier section is not formed and the potential of the potential barrier section. Thus, by determining the amount of signal charges on the basis of the amount of signal charges handled by the transfer section, signal charges can be distributed between the respective transfer sections in consideration of the amount of signal charges that the respective transfer sections can handle.

Furthermore, since the control gate section has on its one portion of the region near the image section side the potential barrier section formed, the potential which is high in the image section side and low in the opposite side is generated in the control gate section. Therefore, when signal charges are vertically transferred from the horizontal transfer register on the image section side to the horizontal transfer register on the opposite side, such transferring of signal charges can be carried out more smoothly.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A solid state imaging device provided on a semiconductor body comprising:

a plurality of photo sensing elements arranged in a matrix configuration for receiving a light therein and producing a signal charge corresponding to the amount of the received light;

a plurality of vertical charge transferring means, each vertical charge transferring means arranged at one side of a vertical line of said photo sensing elements, for receiving said signal charge from said photo sensing elements and transferring said signal charge in the vertical direction;

a first horizontal charge transferring means connected to said vertical charge transferring means for receiving said signal charge transferred from a first group of alternate vertical charge transferring means and transferring said signal charge in the horizontal direction to a charge detection section;

a second horizontal charge transferring means connected to said vertical charge transferring means for receiving said signal charge transferred from a second group of alternate vertical charge transferring means which are not selected as said first group of said alternate vertical charge transferring means and transferring said signal charge in the horizontal direction to said charge detecting section, said first horizontal charge transferring means comprising:

first and second horizontal shift registers, each said first and second horizontal shift registers extending in the horizontal direction;

a control gate electrode disposed between said first and second horizontal shift registers and having a plurality of gate portions, each gate portion corresponding to said first group of alternate vertical charge transferring means; and a potential barrier under said control gate electrode, said potential barrier imparting a tiered transfer channel potential profile under said gate electrode with said potential barrier having a shallow potential relative to that of a remainder of said transfer channel under said gate electrode, said potential barrier being located closer to said first horizontal shift registers than said remainder of said transfer channel under said gate electrode, said profile being configured such that application of a signal to said gate electrode simultaneously affects all portions of said profile thereunder thereby maintaining said profile, said potential barrier employable to distribute into said first and second horizontal shift registers signal charge received from said first group of alternate vertical charge transferring means by allowing said signal charge to pass through said transfer channel under said gate electrode while said gate electrode is in a first state, and by pinching off passage of said signal charge through said transfer channel while said gate electrode is in a second state.

2. A solid state imaging device according to claim 1, wherein said potential barrier is formed under said control gate electrode.

3. The solid state imaging device of claim 1, wherein said potential barrier is formed by different impurity implantation between said potential barrier and the remainder of the transfer channel under the gate electrode.

4. The solid state imaging device of claim 1, wherein said control gate is formed with a gate oxide film and said potential barrier is formed by shaping a film thickness of the gate oxide film of the control gate.

5. A method of operating a solid state imaging device provided on a semiconductor body having a plurality of photo sensing elements for receiving a light therein and producing a signal charge, a plurality of vertical charge transferring means for receiving and transferring said signal charge from said photo sensing elements to first and second horizontal charge transferring means, said first and second horizontal charge transferring means each for receiving and transferring said signal charge from said vertical charge transferring means to a charge detecting section through a transfer channel, which comprises the steps of:

a) receiving the signal charge from a first group of alternative vertical charge transferring means in said first horizontal charge transferring means;

b) accumulating said signal charge under both a first horizontal shift register and a control gate;

c) dividing said signal charge by raising a potential barrier located under said control gate to pinch off passage of signal charge over said potential barrier through said transfer channel and causing signal charge to appear on opposite sides of said potential barrier, and distributing part of said signal charge to said first horizontal shift register;

d) transferring said distributed signal charge in said first horizontal shift register to said charge detecting section;

e) shifting and distributing a remaining part of said signal charge accumulated under said control gate to a second horizontal shift register; and f) transferring said distributed remaining part of said signal charge in said second horizontal shift register to said charge detecting section, wherein said first horizontal shift register is closer to an image area than said second horizontal shift register;

wherein said potential barrier has a same or deeper potential than said first horizontal shift register when said first horizontal shift register and said control gate are accumulating said signal charge; and wherein the potential under said control gate electrode is made shallower when said potential barrier is dividing said signal charge.

* * * * *